(12) United States Patent
Korenari et al.

(10) Patent No.: US 7,633,571 B2
(45) Date of Patent: Dec. 15, 2009

(54) THIN-FILM TRANSISTOR WITH SEMICONDUCTOR LAYER AND OFF-LEAK CURRENT CHARACTERISTICS

(75) Inventors: Takahiro Korenari, Minato-ku (JP); Hiroshi Tanabe, Minato-ku (JP); Nobuya Seko, Minato-ku (JP)

(73) Assignee: NEC Corporation, Tokyo (JP)

( * ) Notice: Subject to any disclaimer, the term of this patent is extended or adjusted under 35 U.S.C. 154(b) by 163 days.

(21) Appl. No.: 11/029,405

(22) Filed: Jan. 6, 2005

(65) Prior Publication Data
US 2005/0212987 A1    Sep. 29, 2005

(30) Foreign Application Priority Data
Jan. 9, 2004    (JP) .............................. 2004-004746

(51) Int. Cl.
*G02F 1/136* (2006.01)
(52) U.S. Cl. .............................. 349/43; 349/41; 349/42; 349/46; 439/149
(58) Field of Classification Search ............. 349/41–43, 349/44, 46; 439/149
See application file for complete search history.

(56) References Cited

U.S. PATENT DOCUMENTS

| | | | |
|---|---|---|---|
| 6,462,723 B1 * | 10/2002 | Yamazaki et al. | 345/82 |
| 6,771,346 B2 * | 8/2004 | Sugimoto et al. | 349/149 |
| 6,803,982 B2 * | 10/2004 | Komatsu | 349/141 |
| 2003/0107077 A1 * | 6/2003 | Yamazaki et al. | 257/314 |
| 2007/0020888 A1 * | 1/2007 | Yamazaki et al. | 438/459 |

FOREIGN PATENT DOCUMENTS

| | | |
|---|---|---|
| JP | H10-111520 A | 4/1998 |
| JP | 2001-222001 A | 8/2001 |
| JP | 2002-190606 A | 7/2002 |
| JP | 2002-313810 A | 10/2002 |
| JP | 2003-229578 JP | 8/2003 |
| JP | 2003-270663 A | 9/2003 |
| JP | 2004-012726 A | 1/2004 |

\* cited by examiner

*Primary Examiner*—David Nelms
*Assistant Examiner*—Nathanael R. Briggs
(74) *Attorney, Agent, or Firm*—Sughrue Mion, PLLC

(57) ABSTRACT

Recognizing the phenomenon that the film thickness of a semiconductor layer causes shift in the OFF-leak current characteristic that corresponds to back-gate voltage of a thin-film transistor, the average film thickness of a semiconductor layer is prescribed such that the shift of the OFF-leak current characteristic is reduced. Alternatively, the film thickness distribution (the ratio of the occurrence of each region having different film thickness) in the direction of the channel width of the semiconductor layer is prescribed.

10 Claims, 7 Drawing Sheets

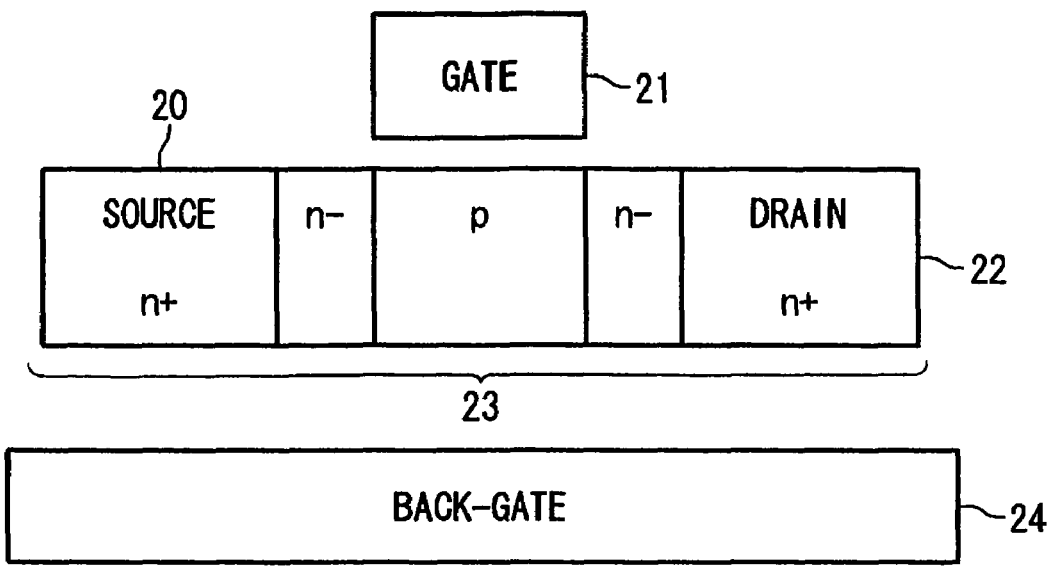
F I G. 4
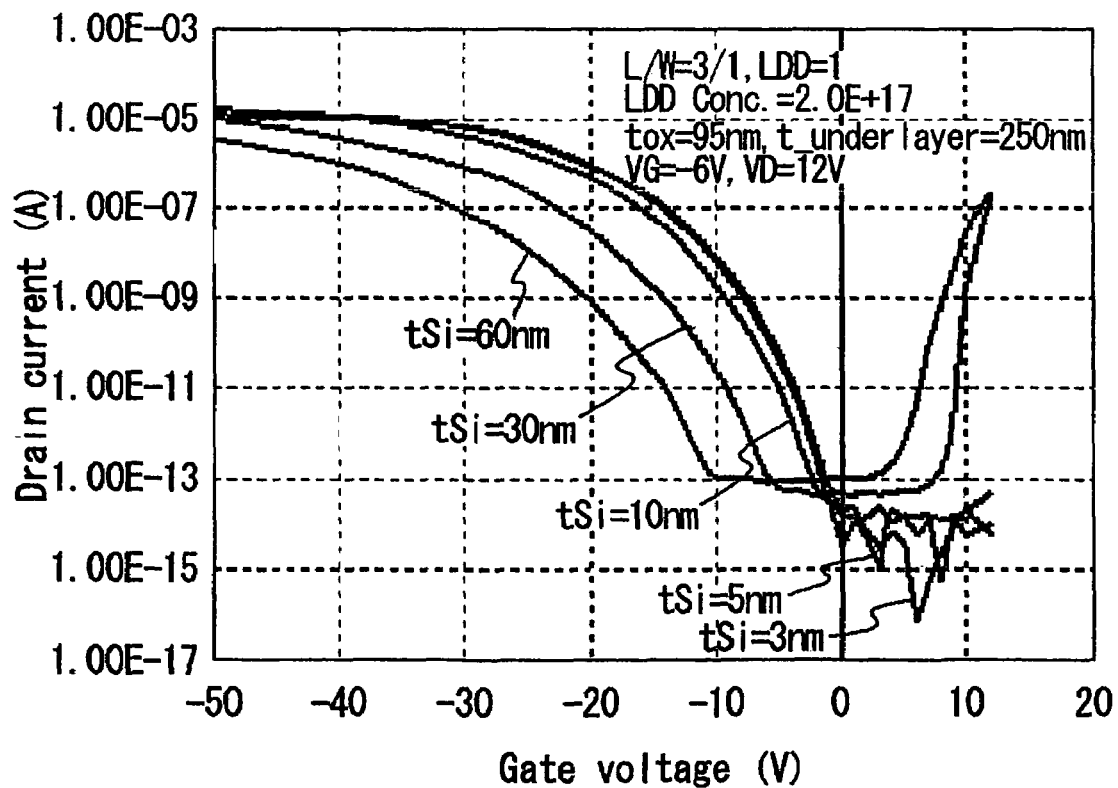
F I G. 5

THIN-FILM TRANSISTOR WITH SEMICONDUCTOR LAYER AND OFF-LEAK CURRENT CHARACTERISTICS

BACKGROUND OF THE INVENTION

1. Field of the Invention

The present invention relates to a thin-film transistor that is used in such devices as liquid crystal display devices.

2. Description of the Related Art

A major reason for forming thin-film transistors on translucent substrates composed of materials such as glass or quartz is to realize optically transparent optical devices. An active matrix liquid crystal display device is a representative example of an optically transparent optical device in which thin-film transistors are used in the control of display pixels. Liquid crystal display devices are used in various types of portable equipment such as personal computers, mobile telephones, or personal digital assistants (PDAs), and more recently, in thin-screen television image receivers. In these types of equipment, direct-view liquid crystal display devices are used in which the image that is displayed on a panel is viewed directly by the unaided eye. Liquid crystal display devices are also employed in the enlargement/projection optics of projectors for projecting an image onto a screen.

A liquid crystal display device (liquid crystal light valve) that is used in a projector typically irradiates a far more intense light than a direct-view liquid crystal display device. For example, if a type-1 screen that is enlarged to the equivalent of a type-100 screen projects an image onto a screen having the same level of brightness as a type-15 direct-view liquid crystal display device, a conversion based on area ratio shows that the amount of light that is irradiated onto a liquid crystal light valve is more 2,000,000 times brighter per unit area than the light irradiated onto the direct-view type. As a result, there is the problem that in an active matrix liquid crystal display device that is used as a liquid crystal light valve, carrier is generated in thin-film transistors due to photoexcitation, thereby increasing leak current (optical leak current) to a high level.

In an active matrix liquid crystal display device, a thin-film transistor is normally turned ON to apply a desired voltage (write voltage) to a pixel electrode, following which the write voltage must be sustained until the next write operation by turning the thin-film transistor OFF. When the optical leak current is great, however, the write voltage that is being maintained will drop, and the screen contrast therefore will also drop.

In order to suppress the optical leak current, instead of forming the active layer directly on a translucent substrate with an underlayer insulating film interposed, the active layer (also referred to as "islands" because it is formed in island form) of a thin-film transistor may be formed after first using a light-blocking material (such as a metal material) to form a light-shield film on an underlayer insulating film, stacking an additional underlayer insulating film, and then forming the semiconductor layer that is the active layer over this underlayer insulating film. In other words, light that is incident from the direction of the translucent substrate may be blocked by means of a light-shield film that is arranged between the active layer and the translucent substrate.

Explanation of the Planar Layout

As shown in FIG. 1, the active matrix liquid crystal display device that is used as a liquid crystal light valve is a construction in which gate electrodes 7 and data electrodes 10 are each arranged in a matrix form such that gate electrodes 7 and data electrodes 10 are orthogonal to each other, and pixel electrodes 18 that are composed of ITO (Indium-Tin Oxide) are arranged in each of the display areas that are partitioned by gate electrodes 7 and data electrodes 10. Thin-film transistors (TFT) for applying write voltage to pixel electrodes 18 are formed in the regions at which gate electrodes 7 and data electrodes 10 intersect.

FIG. 2 is an enlarged view of the region that is enclosed within the oval in FIG. 1 and shows an example of the configuration of the TFT formation region.

As shown in FIG. 2, data electrode 10 is connected to the source of the TFT by way of data electrode TFT contact 16, and drain electrode 8 is connected to the drain of the TFT, which is linked to pixel electrode 18, by way of ITO-TFT contact 17.

The source and the drain of the TFT are each formed in respective semiconductor layers (not shown), and a channel (a region that is covered by gate electrode 7) is formed between the source and drain. In addition, lightly-doped drain (LDD) regions 15 having an impurity concentration that differs from that of the source and drain are formed on the channel sides of each of the source and drain.

Explanation of the Sectional Views

FIG. 3A is a side sectional view showing the appearance of the cut surface as seen from line C-C' of the liquid crystal display device that is shown in FIG. 2, and FIG. 3B is a side sectional view showing the appearance of the cut surface as seen from line D-D' of the liquid crystal display device that is shown in FIG. 2.

As shown in FIGS. 3A and 3B, the liquid crystal display device includes translucent insulation substrate 1 that is composed of a material such as glass, and lower light-shield film 3 is formed on this translucent insulating substrate 1 with underlayer insulating film 2 interposed, and a TFT is formed on first interlayer film 4 that is formed so as to cover lower light-shield film 3.

The TFT is a construction that includes semiconductor layer (polysilicon) 5 in which the source/drain, LDD regions 15, and channel are formed; gate insulating film 6 that is formed on semiconductor layer 5; and gate electrode (see FIG. 3B) 7 that is formed on gate insulating film 6. Data electrode 10 is formed on gate electrode 7 with second interlayer film 9 interposed.

Further, data electrode 10 is formed on second interlayer film 9, third interlayer film 11 is formed so as to cover data electrode 10, and black matrix 12 is formed on third interlayer film 11. On black matrix 12, a common substrate is arranged with a liquid crystal layer interposed (neither being shown).

Black matrix 12 blocks light that is incident from the direction of the opposing common substrate that sandwiches the liquid crystal layer. On the other hand, lower light-shield film 3 blocks light that is incident from the direction of translucent insulating substrate 1 (in the case of a projector, reflected light from the optics).

Explanation of the Black Matrix

Black matrix 12 is in some cases formed within the same substrate as the TFT as shown in FIGS. 3A and 3B, and in some cases is formed within the common substrate that opposes the TFT with the liquid crystal layer interposed.

When black matrix 12 is formed in the common substrate, a positional shift of approximately 10 μm that occurs in the process of stacking the two substrates must be taken into consideration, and black matrix 12 must consequently be formed larger than lower light-shield film 3. As a result, the problem occurs that the open area ratio of the pixels cannot be increased.

Accordingly, the configuration shown in FIGS. 3A and 3B in which black matrix 12 is formed in the same substrate as the TFT is frequently adopted. In this type of configuration, a high level of alignment accuracy can be obtained by taking advantage of the fabrication process of the semiconductor device, and the large misregistration that occurs in the above-described process of stacking the two substrates therefore need not be considered. However, an adequate countermeasure has not been found for blocking the diffuse reflection of light that also occurs within the substrates such as shown in FIGS. 3A and 3B.

Light that is incident from the direction of the common substrate or light that is incident from the direction of translucent insulating substrate 1 is not made up of only components that are parallel to the gate electrode, but includes components of various directions, and there is consequently the concern that the incident light will reach the semiconductor layer that underlies the gate electrode.

For example, in the region in which gate electrode 7 is formed as shown in FIG. 3B, light that is incident from the direction of the common substrate or light that is incident to translucent insulating substrate 1 is adequately blocked by lower light-shield film 3 and black matrix 12.

However, in regions that lack gate electrode 7 as shown in FIG. 3A, the widths of lower light-shield film 3 and black matrix 12 are both typically limited to raise the open area ratio of the pixels. Thus, in these regions that lack gate electrode 7, the width of black matrix 12 is normally set in accordance with the width of lower light-shield film 3 such that light that is incident from the direction of the common substrate does not reflect from the surface of lower light-shield film 3 and reach the semiconductor layer of the TFT. In contrast, light that is incident from the direction of translucent insulating substrate 1 undergoes multiple reflections, for example, between black matrix 12 and lower light-shield film 3 or between data electrode 10 and lower light-shield film 3, and thus reaches the semiconductor layer of the TFT.

A method has consequently been proposed in which a prescribed dc voltage is applied to lower light-shield film 3 as a method for reducing the optical leak current in the above-described TFT (for example, refer to Japanese Patent Laid-Open Publication No. H10-111520). In Japanese Patent Laid-Open Publication No. H10-111520, a substantial reduction of the optical leak current is achieved by applying an optimal dc voltage to lower light-shield film 3 for each TFT.

However, in a liquid crystal display device in which a multiplicity of TFTs is arranged, a common voltage (in the following explanation, this voltage is referred to as the "back-gate voltage") is normally applied to the lower light-shield film 3 of each TFT. Thus, when the optimum value of the voltage that is to be applied to each lower light-shield film 3 varies for each TFT, the back-gate voltage must be set to within an extremely narrow range in order to suppress the leak current (including the optical leak current) of all TFTs to a desired value or less.

The leak current in a TFT in which the back-gate voltage diverges from the optimum value increases markedly and therefore produces display defects in the corresponding pixels of the liquid crystal display device and lowers reliability. In addition, accurately setting the back-gate voltage to a desired voltage necessitates the use of an expensive voltage generation circuit, which raises the additional problem of increased fabrication cost.

SUMMARY OF THE INVENTION

It is an object of the present invention to provide a thin-film transistor that can provide lower fabrication costs and increased reliability.

To realize the above-described object, the present invention focuses on the shift that occurs in the OFF-leak current characteristic with respect to the back-gate voltage of a thin-film transistor depending on the thickness of the semiconductor layer, and prescribes the average thickness of the semiconductor layer of the thin-film transistor such that the amount of shift in the OFF-leak current characteristic is reduced. Alternatively, the present invention prescribes the distribution of film thicknesses (the rate of the occurrence of each region having a different film thickness) of the semiconductor layer in the direction of channel width such that the range of setting of the back-gate voltage is not limited depending on fluctuation in the film thickness.

In the above-described thin-film transistor, prescribing the average thickness of the semiconductor layer of each thin-film transistor to limit the amount of shift in the OFF-leak current characteristic can prevent narrowing of the range of setting of the back-gate voltage.

Alternatively, when the average film thickness of the semiconductor layer is relatively thick and the range of setting the back-gate voltage narrows due to the existence of a distribution of film thicknesses, narrowing of the range of setting the back-gate voltage can be prevented by prescribing the rate of occurrence of each region having a different film thickness with respect to the channel width direction.

Accordingly, a thin-film transistor can be obtained in which the effect of back-gate voltage upon the operation of the thin-film transistor can be suppressed to a minimum, whereby a product can be obtained in which display defects are eliminated and reliability is increased. In addition, the elimination of the need for an expensive voltage generation circuit suppresses increase in the cost of the product.

The above and other objects, features and advantages of the present invention will become apparent from the following description with reference to the accompanying drawings which illustrate examples of the present invention.

BRIEF DESCRIPTION OF THE DRAWINGS

FIG. 4 is a schematic view showing the typical configuration of a TFT that is provided with a back gate;

FIG. 5 is a graph showing the OFF-leak current characteristic that takes the film thickness of the semiconductor layer as a parameter;

DETAILED DESCRIPTION OF THE PREFERRED EMBODIMENTS

Figure 1:
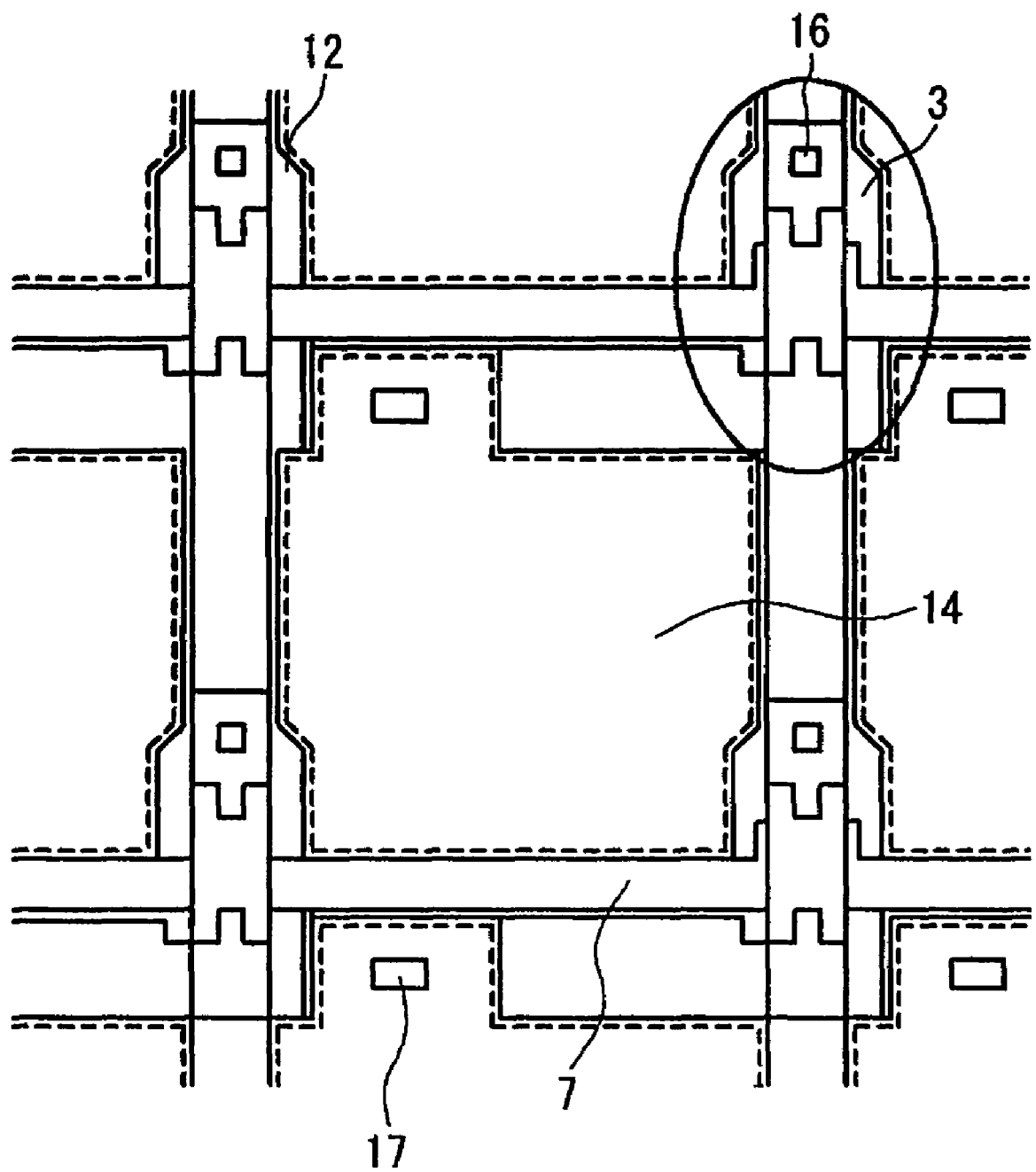
FIG. 1 is a plan view showing an example of the configuration of an active matrix liquid crystal display device.
Figure 2:
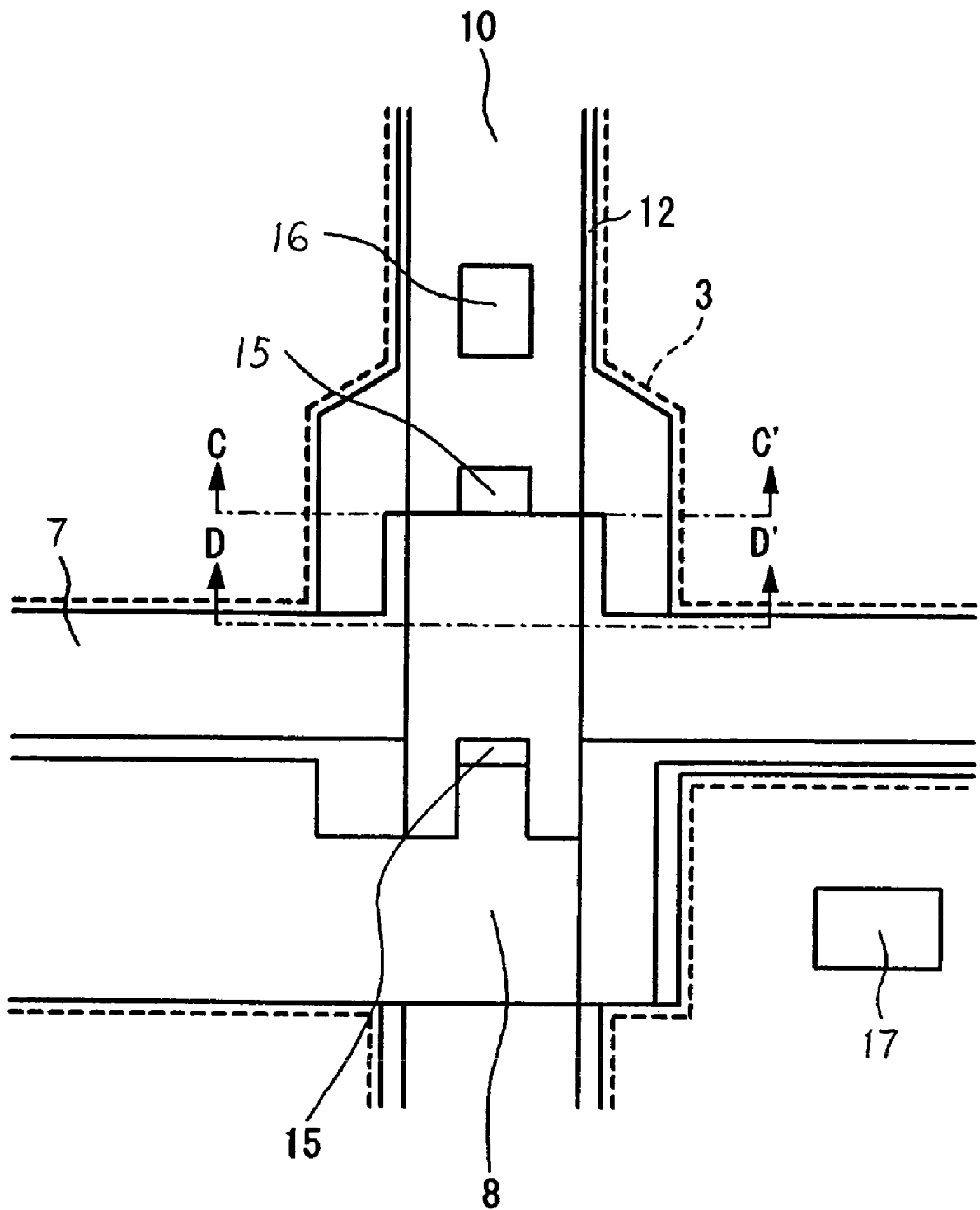
FIG. 2 is an enlargement of the principal region that is enclosed by the oval in FIG. 1.
Figure 3A:
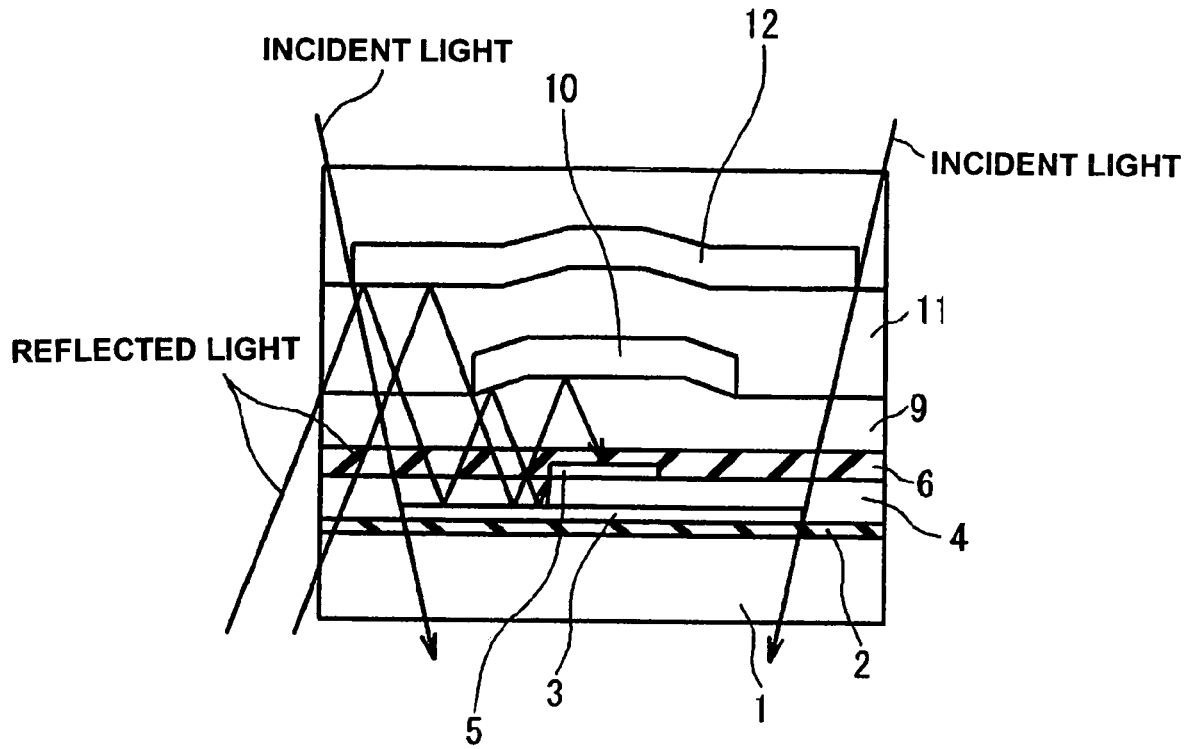
FIG. 3A is a side sectional view showing the appearance of the cut surface as seen from line C-C' of the liquid crystal display device shown in FIG. 2.
Figure 3B:
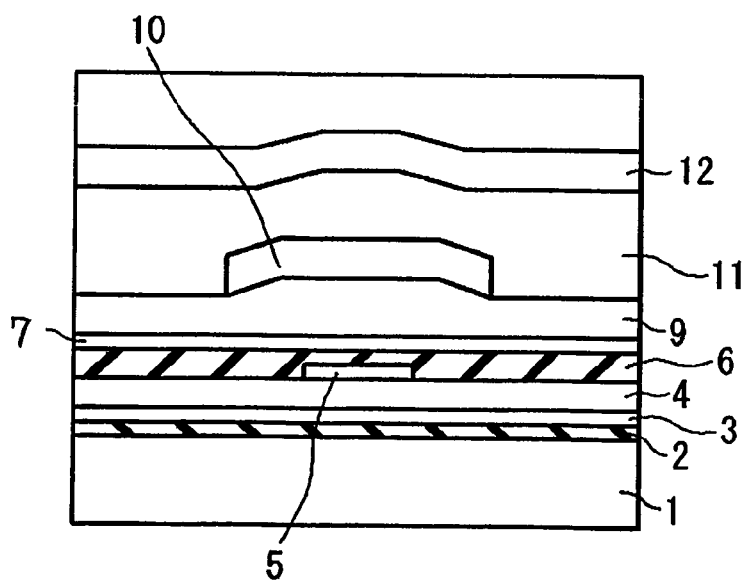
FIG. 3B is a side sectional view showing the appearance of the cut surface as seen from line D-D' of the liquid crystal display device that is shown in FIG. 2.

Explanation next regards the present invention with reference to the accompanying drawings.

The following explanation takes as an example of a TFT the configuration shown in FIG. 4 having: silicon layer (semiconductor layer) 23 that is provided with a channel portion (p), LDD regions 23 (n⁻), source (SOURCE) 20, and drain (DRAIN) 22; gate (GATE) electrode 21 that is formed on silicon layer 23 with a gate insulating film (not shown) interposed; and back-gate (BACK-GATE) 24 that is formed under silicon layer 23 with an interlayer insulating film (not shown) interposed. Back-gate 24 corresponds to lower light-shield film 3 that is arranged in the TFT formation region of the above-described liquid crystal display device.

The present applicants discovered that, in the configuration that is shown in FIG. 4, the characteristic of the leak current when the TFT is OFF (hereinbelow referred to as the "OFF-leak current") with respect to the back-gate voltage changes in accordance with the film thickness (average value) of silicon layer 23. FIG. 5 is a graph showing the relation between drain current with respect to the back-gate voltage in a TFT in which the channel length is 3 microns, the LDD length is 1 micron, and the impurity concentration of the LDD region is 2.0 E+17 atm/cm³ when the gate voltage VG is −6V (OFF state) and the drain voltage VD is 12 V.

As shown in FIG. 5, the drain current of the TFT varies according to the back-gate voltage, but this characteristic (hereinbelow referred to as the "OFF-leak current characteristic") shifts in accordance with the film thickness (tSi) of silicon layer 23. In other words, in the example that is shown in FIG. 5, when the film thickness (average value) of silicon layer 23 is 60 nm, the OFF-leak current reaches its lowest level when the back-gate voltage is −10 V. Further, when the film thickness (average value) of silicon layer 23 is 30 mm, the OFF-leak current reaches its lowest level when the back-gate voltage is −5 V, and when the film thickness (average value) of silicon layer 23 is 10 nm, the OFF-leak current reaches its lowest level when the back-gate voltage is 0 V.

It can be seen that the amount of shift in the OFF-leak current characteristic with respect to differences in the film thickness of silicon layer 23 becomes markedly low in regions in which the film thickness of silicon layer 23 is 30 nm or less, and in particular, in regions of silicon layer 23 in which the film thickness is 10 nm or less.

The present invention focuses on the dependence of the OFF-leak current characteristic upon the film thickness of silicon layer 23, and prescribes the film thickness of silicon layer 23 of each TFT such that the range of setting the back-gate voltage is not limited.

More specifically, when the average film thickness of silicon layer 23 of each TFT is set to 30 nm or less, and more preferably, set to 10 nm or less, the OFF-leak current characteristic of each TFT becomes substantially equal, and the narrowing of the range of setting the back-gate voltage can therefore be prevented.

Figure 6A:
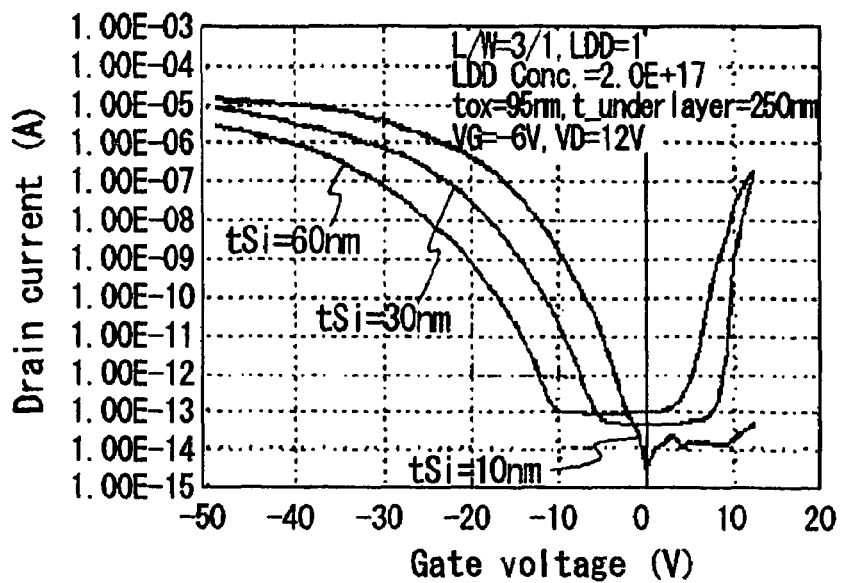
FIGS. 6A-C are graphs showing the OFF-leak current characteristic that takes the impurity concentration of the LDD regions as a parameter.
Figure 6B:
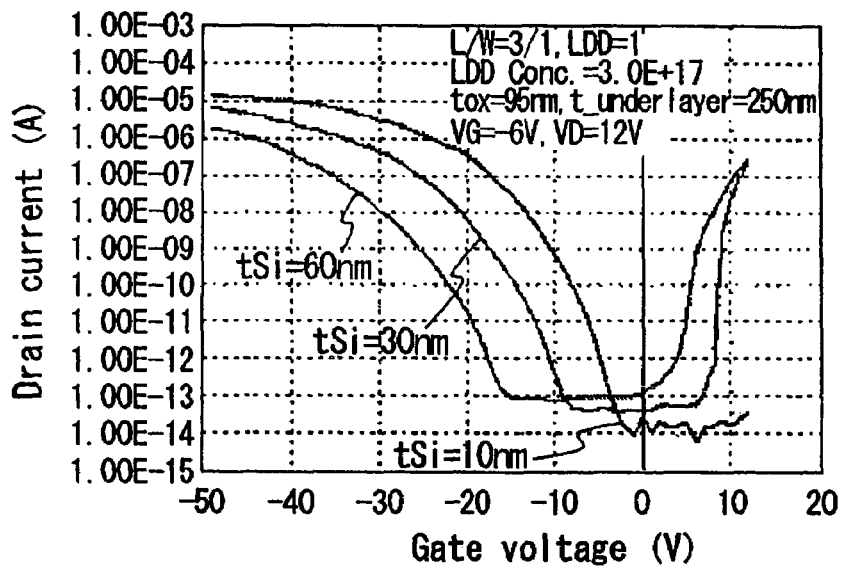
Figure 6C:
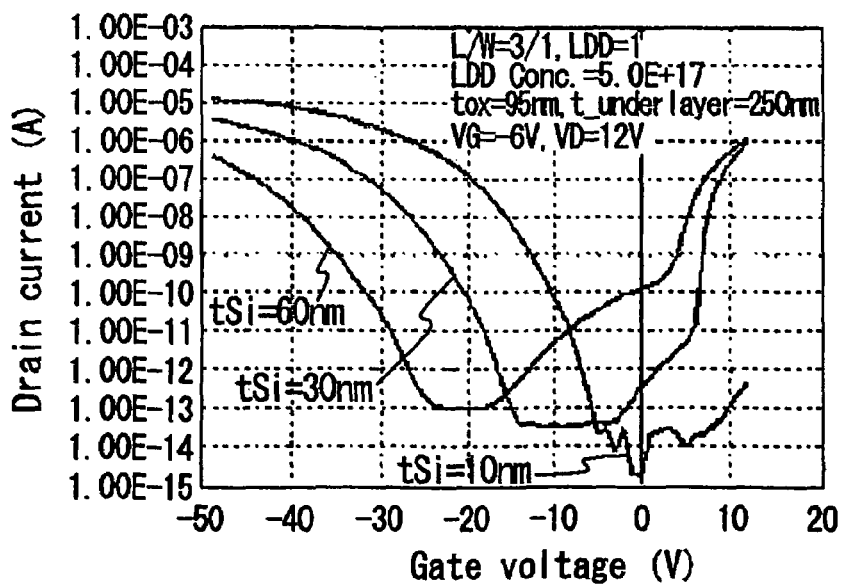

As shown in FIGS. 6A-C, the OFF-leak current characteristic shifts when the impurity concentration in the LDD regions is varied, and the amount of this shift increases with greater film thickness of silicon layer 23 (for example, 60 nm). However, if the film thickness of silicon layer 23 is 30 nm or less, and particularly if the film thickness is 10 nm or less, the amount of shift in the OFF-leak current characteristic will remain small despite change in the impurity concentrations of the LDD regions. Thus, when considered from this standpoint as well, the film thickness of silicon layer 23 is preferably limited to 30 nm or less, and particularly to 10 nm or less.

However, the film thickness of silicon layer 23 that is actually formed on a substrate is not uniform, and the film thickness varies in the direction of channel width (a film thickness distribution exists). As an example, the edge portions of silicon layer 23 may be formed in a tapered shape. When a distribution exists for the film thickness in the direction of channel width in silicon layer 23, the amount of change in the film thickness influences the OFF-leak current characteristic and severely limits the setting range even when the back-gate voltage is individually set for each TFT.

For example, when the back-gate voltage is set to −10V in a TFT having the OFF-leak current characteristic that is shown in FIG. 5, the OFF-leak current falls to its lowest level in regions in which the film thickness of silicon layer 23 is 60 nm, and the OFF-leak current therefore becomes sufficiently lower than the preset permissible limit (for example, 5 pA). However, the OFF-leak current becomes four times the above-described limit value in regions in which the film thickness of silicon layer 23 is 30 nm, and the OFF-leak current becomes 400 times the above-described limit value in regions in which the film thickness of the silicon layer 23 is 10 nm. Thus, even if the average film thickness is 60 nm, the existence of regions in which the film thickness is 30 nm or in which the film thickness is 10 nm will result in a narrowing of the range for setting the back-gate voltage.

In the present invention, when the basic film thickness of silicon layer 23 is, for example, 60 nm, the ratio of the occurrence of regions in which the film thickness of silicon layer 23 is 30 nm to the overall channel width is set to ¼ or less, and the ratio of the occurrence of regions in which the film thickness of silicon layer 23 is 10 nm to the overall channel width is set to ¹⁄₄₀₀ or less.

More specifically, when the average film thickness of the silicon layer is 60 nm, the ratio of the occurrence of regions in which the film thickness is 30 nm to the channel width direction is f (t=30 nm)<0.25. Further, the ratio of the occurrence of regions in which the film thickness is 10 nm or less is f (t=10 nm)<0.0025. Prescribing the variation of film thickness of silicon layer 23 in this way enables the suppression of the OFF-leak current of the TFT to within the above-described limit when the back-gate voltage is −10 V, and enables the suppression of the influence of the variation in film thickness of silicon layer 23 upon the OFF-leak current characteristic.

In more general terms, the film thickness of silicon layer 23 and the distribution of the film thickness in the channel width direction (the ratio of occurrence of regions having each film thickness) are set to satisfy the following formula (1):

[formula (1)]

$$\int_{t\,min}^{t\,max} f(t) \cdot I_D(V_b, t) dt < I_{crit} \qquad (1)$$

where f(t) is the probability of the existence of a region of film thickness t in silicon layer 23; $I_D$(Vb, t) is the drain current at film thickness t and back-gate voltage Vb; and Icrit is the upper limit for the OFF-leak current per unit channel width.

f(t) is the ratio of channel width W(t) of regions having film thickness t to the channel width of the entire region Wtotal in silicon layer 23. In other words:

[formula (2)]

$$f(t) = W(t)/W_{total} \quad (2)$$

f(t) is preferably prescribed by an integrated value as shown in formula (1), but may also be prescribed to be equal to or less than Icrit in each region having film thickness t. In other words, f(t) may be prescribed such that an integrated item is equal to or less than Icrit, as shown in formula (3):

[formula (3)]

$$f(t) < I_{crit}/(W_{total} \cdot I_D(V_b, t)) \quad (3)$$

Figure 7A:
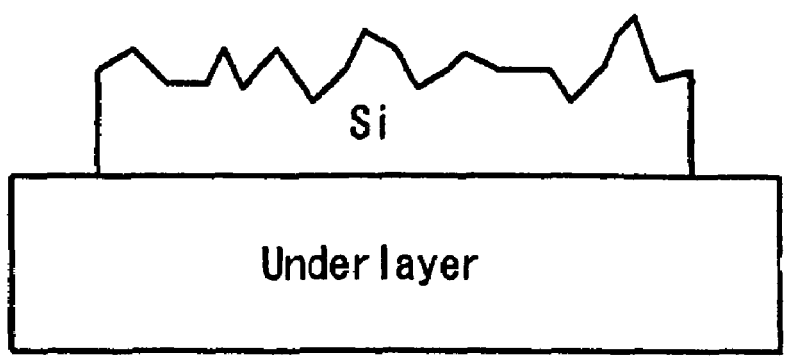
FIGS. 7A-D are schematic views showing examples of variation in the film thickness of a semiconductor layer that is provided in a TFT.
Figure 7B:
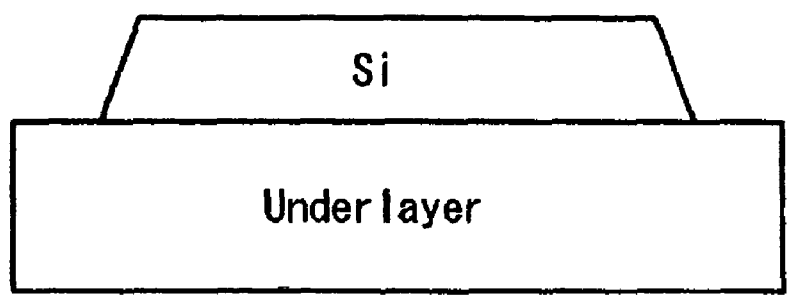
Figure 7C:
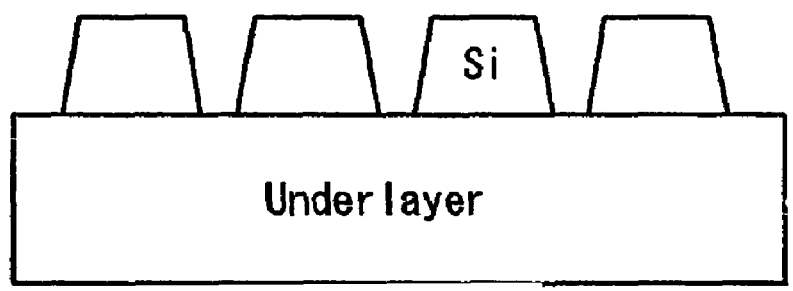
Figure 7D:
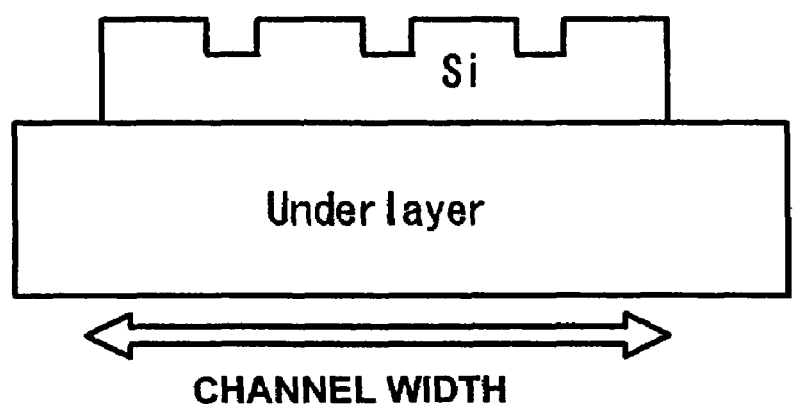

In addition to those factors that result from the intended configuration, variations in the film thickness t of silicon layer 23 may be caused by, for example, the irregular shape of the surface of silicon layer 23 as shown in FIG. 7A, variation in the film thickness of silicon layer 23 in the direction of channel width such as when the edges of silicon layer 23 are inclined (tapered) as shown in FIG. 7B, division of silicon layer 23 into a plurality of islands as shown in FIG. 7C with the edges of each island being inclined (tapered), formation of trenches in the direction of channel width as shown in FIG. 7D or the formation of unevenness in the surface, or a combination of any of these forms. FIGS. 7A-7D all show the appearance in which the silicon layer (Si) of the TFT is formed on an underlayer that is composed of, for example, an insulating film.

According to the present invention, prescribing the average film thickness of silicon layer 23 so as to reduce the amount of shift in the OFF-leak current characteristic can prevent a narrowing of the setting range of the back-gate voltage.

When the average film thickness of silicon layer 23 is relatively great and the range of setting the back-gate voltage is narrowed due to the existence of a distribution of film thicknesses, the narrowing of the setting range of the back-gate voltage can be prevented by prescribing the ratios of occurrence of each of the regions having different film thicknesses to the direction of channel width.

Accordingly, a thin-film transistor can be obtained in which the influence of the back-gate voltage upon operation is suppressed to a minimum.

Referring to the accompanying drawings, explanation next regards a liquid crystal display device that is equipped with the above-described thin-film transistor.

Figure 8:
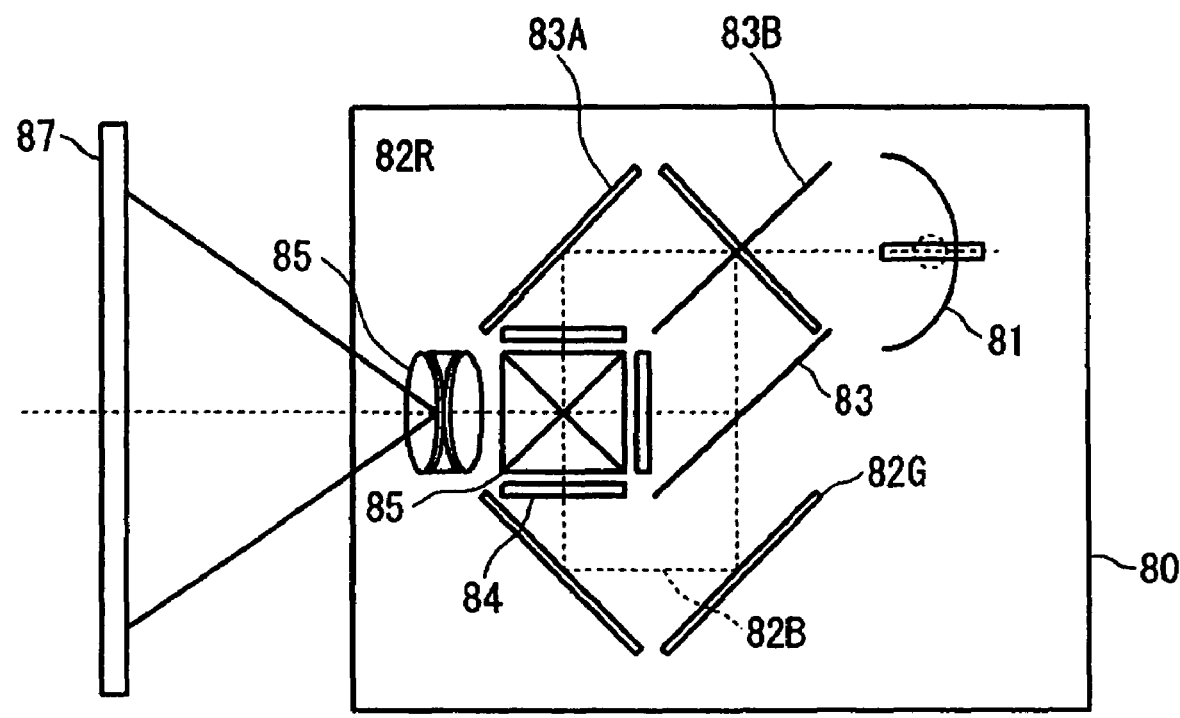
FIG. 8 is a sectional view showing an example of the configuration of a liquid crystal projector having a liquid crystal light valve.

FIG. 8 is a block diagram showing an example of the configuration of a liquid crystal projector that is equipped with the liquid crystal display device of the present invention.

As shown in FIG. 8, liquid crystal projector 80 is a construction that includes: halogen lamp 81 which is the light source for image projection; color separation optics 83 for separating the white light that is radiated from halogen lamp 81 into beams 82R, 82G, and 82B of three colors red, green, and blue; three liquid crystal light valves 84 provided for each of red, green, and blue; color synthesizing optics 85 for combining the light that has been transmitted by the three liquid crystal light valves 84; and projection optics that includes a projection lens 86 for enlarging and projecting light that has been combined onto screen 87.

Color separation optics 83 is a construction that includes, for example, mirror 83A and dichroic mirror 83B, and color-synthesizing optics 85 is a construction that includes, for example, a dichroic prism. Transmissive liquid crystal display devices are used in the liquid crystal light valves 84.

Figure 9:
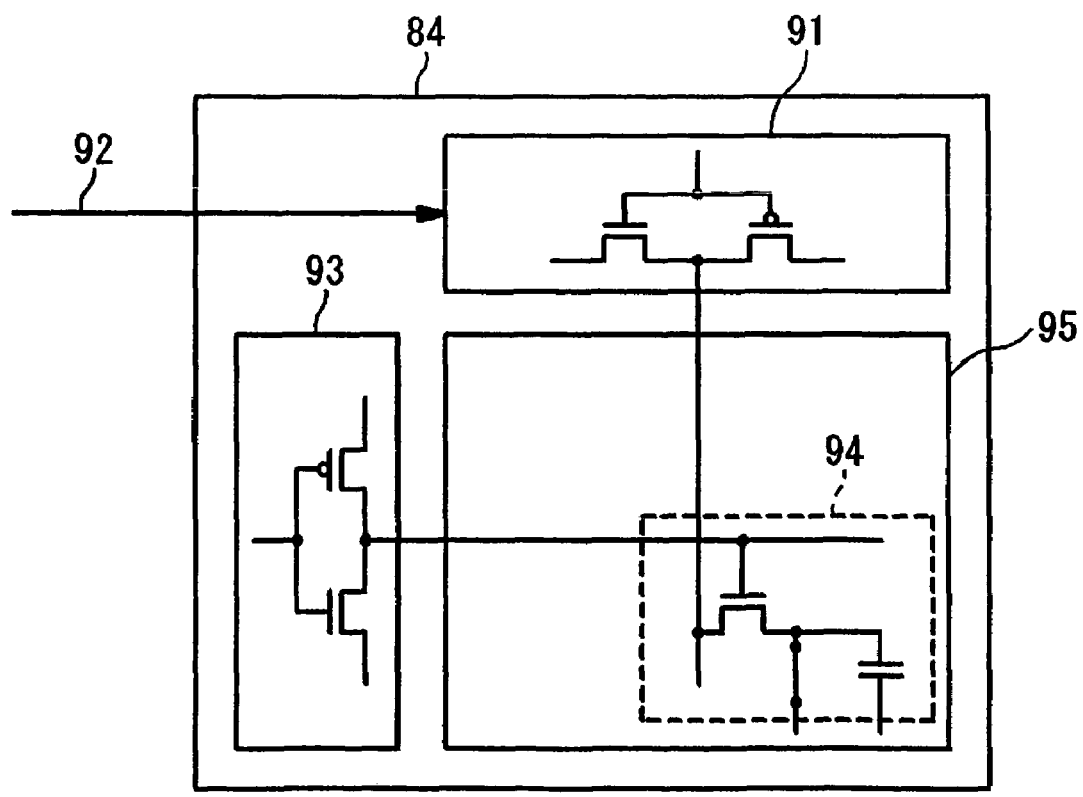
FIG. 9 is a block diagram showing an example of the configuration of the drive circuit of the liquid crystal light valve that is shown in FIG. 8.

FIG. 9 is a block diagram showing an example of the construction of the TFT drive circuit of the liquid crystal light valve that is shown in FIG. 8. As shown in FIG. 9, liquid crystal light valve 84 is a construction that includes: data driver 91 that is connected to a data electrode; data input line 92 for applying an image signal input from the outside to data driver 91; gate driver 93 that is connected to a gate electrode; TFT 94 that is connected to each of data driver 91 and gate driver 93; and pixel 95 in which light transmission is controlled by TFT 94.

In FIG. 9, only one of each of data driver 91, data input line 92, gate driver 93, TFT 94, and pixel 95 are shown in the interest of facilitating understanding of the configuration, but an actual liquid crystal light valve 84 is a construction in which a multiplicity of pixels 95 and TFTs 94 are arranged in matrix form and in which a multiplicity of data drivers 91, data input lines 92, and gate drivers 93 are provided corresponding to each TFT 94 and pixel 95.

By equipping this type of liquid crystal display device with the thin-film transistor of the above-described present invention, a product can be obtained in which display defects are eliminated and that features high reliability. In addition, the elimination of the need for an expensive voltage generation circuit suppresses increase in the cost of the product.

While a preferred embodiment of the present invention has been described using specific terms, such description is for illustrative purposes only, and it is to be understood that changes and variations may be made without departing from the spirit or scope of the following claims.

What is claimed is:

1. A thin-film transistor, comprising:

a substrate;

a semiconductor layer in which a source, a drain, and a channel are formed; and a back-gate that is formed between said substrate and said semiconductor layer having interposed insulating layers and to which a prescribed voltage is applied;

wherein, when:

t is a film thickness of said semiconductor layer, f(t) is the ratio of occurrence of regions that is the ratio of channel width W(t) of regions having film thickness t to the channel width of the entire region Wtotal in said semiconductor layer, Vb is the voltage that is applied to said back-gate, $I_D$(Vb, t) is a drain current that flows under conditions in which the film thickness of said semiconductor layer is t and the voltage that is applied to said back-gate is Vb, and Icrit is an OFF-leak current limit, which is the drain current that flows when said thin-film transistor is turned OFF, said ratio of occurrence f(t) of said semiconductor layer satisfies a relation:

$$f(t) < I_{crit}/(W_{total} \cdot I_D(V_b, t))$$

wherein Icrit is 5.00E-12 A.

2. The thin-film transistor according to claim 1, wherein said semiconductor layer has the film thickness distribution in the direction of channel width, and an average value of the film thickness of said semiconductor layer is 30 nm or less, and wherein edges of said semiconductor layer are tapered.

3. The thin-film transistor according to claim 2, wherein the average value of the film thickness of said semiconductor layer is 10 nm or less.

4. The thin-film transistor according to claim 1, wherein said semiconductor layer includes lightly-doped drain (LDD) regions, in which impurity concentrations differ from that of said source and said drain, on said channel side of said source and on said channel side of said drain.

5. The thin-film transistor according to claim 2, wherein said semiconductor layer includes lightly-doped drain (LDD) regions, in which impurity concentrations differ from that of said source and said drain, on said channel side of said source and on said channel side of said drain.

6. A liquid crystal display device that includes thin-film transistors according to claim 4.

7. A liquid crystal display device that includes thin-film transistors according to claim 5.

8. The thin-film transistor according to claim 2, wherein the average value of the film thickness of said semiconductor layer is 5 nm or less.

9. The thin-film transistor according to claim 1, wherein the average value of the film thickness of said semiconductor layer is 10 nm or less.

10. The thin-film transistor according to claim 1, wherein said ratio of the occurrence of regions, in which the film thickness of said semiconductor layer is ½ of the basic film thickness of the overall channel width, is set to 0.25 or less, and said ratio of the occurrence of regions, in which the film thickness of said semiconductor layer is ⅙ or less of the basic film thickness of the overall channel width, is set to 0.0025 or less.

* * * * *